(12) United States Patent
Simpson et al.

(10) Patent No.: US 9,329,485 B2
(45) Date of Patent: May 3, 2016

(54) METHOD FOR MAKING LITHOGRAPHIC PRINTING PLATES

(71) Applicants: Christopher D. Simpson, Osterode (DE); Harald Baumann, Osterode (DE); Michael Flugel, Osterode (DE); Saija Werner, Hattorf (DE); Oliver Piestert, Schwetzingen (DE); Udo Dwars, Herzberg (DE)

(72) Inventors: Christopher D. Simpson, Osterode (DE); Harald Baumann, Osterode (DE); Michael Flugel, Osterode (DE); Saija Werner, Hattorf (DE); Oliver Piestert, Schwetzingen (DE); Udo Dwars, Herzberg (DE)

(73) Assignee: EASTMAN KODAK COMPANY, Rochester, NY (US)

(*) Notice: Subject to any disclaimer, the term of this patent is extended or adjusted under 35 U.S.C. 154(b) by 0 days.

(21) Appl. No.: 14/484,333

(22) Filed: Sep. 12, 2014

(65) Prior Publication Data

US 2016/0077437 A1    Mar. 17, 2016

(51) Int. Cl.
   *G03F 7/32*     (2006.01)
   *G03F 7/38*     (2006.01)
   *B41C 1/10*     (2006.01)

(52) U.S. Cl.
   CPC .............. *G03F 7/38* (2013.01); *B41C 1/1008* (2013.01)

(58) Field of Classification Search
   CPC ...................................... G03F 7/322
   See application file for complete search history.

(56) References Cited

U.S. PATENT DOCUMENTS

| | | | |
|---|---|---|---|
| 7,115,352 B2 | 10/2006 | Nagase | |
| 7,745,090 B2 | 6/2010 | Mitsumoto et al. | |
| 7,767,382 B2 | 8/2010 | Van Damme et al. | |
| 8,067,145 B2 | 11/2011 | Adachi | |
| 8,105,755 B2 | 1/2012 | Baumann et al. | |
| 2006/0014104 A1* | 1/2006 | Vermeersch | B41C 1/1025 430/302 |
| 2009/0148794 A1* | 6/2009 | Baumann | B41C 1/1008 430/302 |
| 2010/0047537 A1 | 2/2010 | Kuramoto et al. | |
| 2010/0129756 A1 | 5/2010 | Gries et al. | |
| 2010/0304304 A1* | 12/2010 | Piestert | G03F 7/322 430/302 |

FOREIGN PATENT DOCUMENTS

| | | |
|---|---|---|
| EP | 1621339SA1 | 2/2006 |
| EP | 2128704 A2 | 12/2009 |
| EP | 2131239 A1 | 12/2009 |
| JP | 2007-114572 | 5/2007 |
| JP | 2012-189809 | 10/2012 |

* cited by examiner

*Primary Examiner* — Chanceity Robinson
(74) *Attorney, Agent, or Firm* — J. Lanny Tucker

(57) ABSTRACT

Lithographic printing plates are provided by imagewise exposing negative-working lithographic printing plate precursors having a negative-working radiation-sensitive imageable layer, followed by contacting with a processing solution that has a pH of at least 7 and up to and including 11. This processing solution also includes component (1) that is a nitrogen-containing base having an atmospheric pressure melting point of at least 40° C.; component (2) that is a non-ionic surfactant that independently has an atmospheric pressure melting point, glass transition temperature, or pour point of at least 40° C.; component (3) that is a hydroxy-containing solution promoter; and component (4) that is a hydrophilic surface protective compound. The method is carried out in a manner such that the exposed and processed precursor is not further treated with any liquid (such as gumming or rinsing solution) between processing and mounting onto a printing press.

17 Claims, No Drawings

METHOD FOR MAKING LITHOGRAPHIC PRINTING PLATES

FIELD OF THE INVENTION

This invention relates to a method for preparing lithographic printing plates from negative-working lithographic printing plate precursors. After imagewise exposure, such exposed precursors are processed one or more successive times using a weakly alkaline processing solution containing a unique combination of components to provide excelling printing plate durability, low tackiness, high loading capacity (long processing cycles), and clean removal of non-exposed materials. The method of this invention can be carried out without any gumming or rinsing procedures between the processing (development) steps and mounting the lithographic printing plate on a printing press.

BACKGROUND OF THE INVENTION

In lithographic printing, lithographic ink receptive regions, known as image areas, are generated on a hydrophilic surface. When the hydrophilic surface is moistened with water and lithographic ink is applied, the hydrophilic regions retain the water and repel the lithographic ink and the lithographic ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer (processing solution), revealing the underlying hydrophilic surface of the substrate. If the exposed regions are removed, the precursor is considered as positive-working. Conversely, if the non-exposed regions are removed, the precursor is considered as negative-working. In each instance, the regions of the imageable layer(s) that remain are lithographic ink-receptive, and the regions of the hydrophilic surface revealed by the developing process accept water or aqueous solutions (typically a fountain solution), and repel lithographic ink.

"Laser direct imaging" methods (LDI) are used to directly form an offset lithographic printing plate or printing circuit board using digital data from a computer. There have been considerable improvements in this field from use of more efficient lasers, improved imageable compositions and components thereof, and improved processing compositions and procedures.

Various radiation-sensitive compositions are used in negative-working lithographic printing plate precursors as described in numerous publications such as U.S. Pat. No. 7,767,382 (Van Damme et al.) that describes a method of forming lithographic printing plates without rinsing after processing (development). Many other publications provide details about such negative-working radiation-sensitive compositions comprising necessary imaging chemistry dispersed within suitable polymeric binders. After imaging, the negative-working lithographic printing plate precursors are developed (processed) to remove the non-imaged (non-exposed) regions of the imageable layer.

Processing solutions have been designed for each type of lithographic printing plate precursor and imaging chemistry, and thus numerous processing solutions have been uniquely designed for use with each type of imaging chemistry. Some processing solutions comprise one or more anionic or non-ionic surfactants, one or more organic solvents, and other addenda to provide desired pH (usually less than 12.5) and processing properties.

For example, EP 2,128,704 A2 (Hirano et al.) describes the preparation of lithographic printing plates from negative-working lithographic printing plate precursors using imagewise exposure and processing with a solution having a pH of 8 to 11.5 and comprising a water-soluble amine, and an anionic or nonionic surfactant or a water-soluble polymer. This same processing solution can be used for gumming so that separate gumming and rinsing steps can be avoided before squeeze rolling to remove excess processing solution, drying, and printing. The exposed and processed precursor is also contacted with the usual gumming solutions. Other details of processing including possible processing equipment are provided in [00242]-[0250].

While there have been great interest and attempts in the art to design processing solutions for the combination of development and gumming (without post-rinsing), it has been found that the exposed and processed precursors can exhibit excessive stickiness, which tends to impede normal pre-press and printing press operations.

SUMMARY OF THE INVENTION

The problems described above are addressed with the present invention that is a method for preparing a lithographic printing plate, the method comprising:

(a) imagewise exposing a negative-working lithographic printing plate precursor comprising a substrate having disposed thereon a negative-working radiation-sensitive imageable layer, and optionally, a hydrophilic overcoat disposed on the negative-working radiation-sensitive imageable layer, to provide an exposed precursor comprising exposed regions and non-exposed regions in the negative-working radiation-sensitive imageable layer;

(b) optionally heating the exposed precursor to a temperature of at least 60° C. and up to and including 180° C.;

(c) optionally washing the exposed precursor to remove the hydrophilic overcoat;

(d) treating the exposed precursor with one or more successive applications of a processing solution to provide an exposed and processed precursor, the processing solution having a pH of at least 7 and up to and including 11 and comprising:

component (1) that is a nitrogen-containing base having an atmospheric pressure melting point of at least 40° C., and is present in an amount of at least 1 weight % based on the total processing solution weight;

component (2) that is a non-ionic surfactant that independently has an atmospheric pressure melting point, glass transition temperature, or pour point of at least 40° C., and is present in an amount of at least 1 weight % based on the total processing solution weight;

component (3) that is a hydroxy-containing solution promoter that is present in an amount of at least 0.5 weight % based on the total processing solution weight; and component (4) that is a hydrophilic surface protective compound that can be present in an amount of at least 1 weight % based on the total processing solution weight;

(e) optionally, drying the exposed and processed precursor; and (f) mounting the exposed and processed precursor on a printing press, with the proviso that the exposed precursor is not further treated with any liquid between (d) and (f).

In some embodiments of this invention, all of features (a) through (f) are essential to providing lithographic printing plates and using them for lithographic printing.

In some embodiments, the exposed precursor is treated with a single application of the processing solution. In other embodiments, two successive applications of the processing solution are carried out, optionally with a drying step between the successive applications of processing solution.

The unique combination of components (1) through (4), in the designated amounts, in each of the one or more successive applications of the processing solution provides the advantages described herein in the preparation of lithographic printing plates from negative-working lithographic printing plate precursors. These advantages include minimal negative effect on printing plate durability as a result of prolonged contact of the lithographic printing plate by residual processing fluids, low tackiness of the lithographic printing plate covered with residual processing fluids after normal drying within typical automatic processors, high loading capacity (long processing cycles), and clean removal of non-exposed materials. All of these advantages can be achieved without any rinsing or gumming operations between use of the last of the successive applications processing solution and mounting the exposed and processed precursor onto a printing press. Leaving out one or more of components (1) through (4) diminishes the effectiveness of the processing solution for one or more of the noted properties.

Compared to known processing solutions containing borate, phosphate, carbonate, or hydrogen carbonate buffering systems, the processing solution used in the present invention containing the nitrogen-containing base represented by component (1) provides better compatibility with components (2) through (4) that must also be present. As a result, the processing solution can be stored satisfactorily over a broad temperature range without undesirable phase separation.

DETAILED DESCRIPTION OF THE INVENTION

The following discussion is directed to various embodiments of the present invention and while some embodiments can be more desirable for specific uses, the disclosed embodiments should not be interpreted or otherwise considered to limit the scope of the present invention, as claimed below. In addition, one skilled in the art will understand that the following disclosure has broader application than is explicitly described for the discussion of any particular embodiment.

DEFINITIONS

As used herein to define various components of the processing solutions, negative-working radiation-sensitive imageable layer formulations, hydrophilic overcoat formulations, unless otherwise indicated, the singular forms "a," "an," and "the" are intended to include one or more of the components (that is, including plurality referents).

Each term that is not explicitly defined in the present application is to be understood to have a meaning that is customary or commonly accepted by those skilled in the art. If the construction of a term would render it meaningless or essentially meaningless in its context, the term definition can be taken from a standard published dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor," "precursor," and "negative-working lithographic printing plate precursor" are meant to be equivalent references to embodiments of the present invention.

The term "support" is used herein to refer to an aluminum-containing material (web, sheet, foil, or other form) that is then treated to prepare a "substrate" that refers to a hydrophilic article upon which various layers, including the negatively-working imageable layer, are coated.

As used herein, the term "radiation absorber" refers to compounds or materials that are sensitive to certain wavelengths of radiation and can cause polymerization within the layer in which they are disposed.

As used herein, the term "infrared" refers to radiation having a $\lambda_{max}$ of at least 750 nm and higher. In most instances, the term "infrared" is used to refer to the "near-infrared" region of the electromagnetic spectrum that is defined herein to be at least 750 nm and up to and including 1400 nm.

As used herein, the term "UV and violet radiation" generally refers to radiation having a $\lambda_{max}$ of at least 250 nm and up to and including 550 nm. This range also encompasses some of the "visible" range of the electromagnetic spectrum.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

The term "copolymer" refers to polymers composed of two or more different repeating or recurring units that are arranged randomly along the polymer backbone.

For polymeric binders used in this invention, the term "arranged randomly" means that blocks of recurring units are not intentionally incorporated into the polymeric binders, but that recurring units are incorporated into the backbone in a random fashion using known polymerization procedures that do not encourage the formation of block copolymers.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenically unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

Unless otherwise indicated, the term "alkyl" refers to a straight chain or branched and saturated hydrocarbon group comprising 1 to 18 carbon atoms, such as 1 to 10 carbon atoms. The alkyl group can optionally comprise one or more substituents that can be a halogen atom, cyano, nitro, amino, carbonyloxyester or ether group.

Unless otherwise indicated, the term "aryl" refers to an aromatic group optionally with one or more fused rings comprising 5 to 14 carbon atoms. The aryl group can optionally comprise one or more substituents (such as 1 to 3) that can be a halogen atom, alkyl, aryl, cyano, nitro, amino, carbonyloxyester, or ether group. Particularly useful aryl groups are substituted or unsubstituted phenyl or naphthyl groups.

As used herein, the term "layer" or "coating" can consist of one disposed or applied layer or a combination of several sequential disposed or applied layers. The one or more layers are considered radiation-sensitive or negative-working imageable if at least one of the layers is radiation-sensitive.

Uses

The present invention is useful for preparing lithographic printing plates by imagewise exposing and processing the exposed precursor with at least the processing solution described below, in suitable processing apparatus or equipment. This method can be carried out by omitting all rinsing and gumming treatments and steps between use of the processing solution (developer) and mounting the exposed and processed precursor onto a printing press.

Substrate

The substrate that is present in the precursors described herein generally has a hydrophilic surface, or at least a surface that is more hydrophilic than the applied negative-working imageable layer on the imaging side. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 $g/m^2$ and up to and including 5 $g/m^2$ and more typically at least 3 $g/m^2$ and up to and including 4.3 $g/m^2$. Phosphoric acid anodization generally provides an oxide weight on the surface of from at least 1.5 $g/m^2$ and up to and including 5 $g/m^2$ and more typically at least 1 $g/m^2$ and up to and including 3 $g/m^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth) acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in U.S. Publication No. 2013/0052582 (Hayashi) that is incorporated herein with respect to the substrates.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Negative-Working Imageable Layer

Useful precursors can be formed by suitable application of a negative-working radiation-sensitive composition as described below to a suitable substrate to form a negative-working (radiation sensitive) imageable layer on that substrate. In general, the negative-working radiation-sensitive composition (and imageable layer) comprises a free radically polymerizable component, a radiation absorber, an initiator composition that is capable of generating free radicals upon exposure to imaging radiation, and a polymeric binder, which components are described in more detail below. There is generally only a single negative-working imageable layer comprising the negative-working radiation-sensitive composition. It can also be the outermost layer in the precursor, but in some embodiments, there is an outermost water-soluble hydrophilic overcoat layer (also known as a topcoat) disposed over the one or more negative-working imageable layers. Such a hydrophilic overcoat layer is described below.

Many details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Pat. No. 7,672,241 (Munnelly et al.), and U.S. Publication Numbers 2003/0064318 (Huang et al.), 2004/0265736 (Aoshima et al.), 2005/0266349 (Van Damme et al.), 2006/0019200 (Vermeersch et al.), and 2009/0092923 (Hayashi). Some of the noted teachings relate to negative-working radiation sensitive compositions that are used in imaged precursors that are processed off-press using a suitable processing solution, while others relate to on-press developable negative-working radiation sensitive compositions. Only the radiation sensitive compositions and negative-working lithographic printing plate precursors designed for off-press processing are contemplated for the present invention.

The radiation-sensitive compositions and negative-working imageable layers used in precursors include one or more polymeric binders. Useful polymeric binders include but are not limited to, those that are present at least partially as discrete particles (non-agglomerated). Such secondary polymeric binders can be present as discrete particles having an average particle size of at least 10 nm and up to and including 500 nm, and typically of at least 100 nm and up to and including 450 nm, and that are generally distributed uniformly within that layer. The particulate polymeric binders exist at room temperature as discrete particles, for example in an aqueous dispersion. Such secondary polymeric binders generally have a number average molecular weight ($M_n$) of at least 5,000 and typically at least 20,000 and up to and including 1,000,000, or of at least 30,000 and up to and including 200,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (noted above), U.S. Pat. No. 7,005,234 (Hoshi et al.), and U.S. Pat. No. 7,368,215 (Munnelly et al.), and US Publication No. 2005/0003285 (Hayashi et al.), the disclosures of all of which are incorporated herein by reference with respect to these polymeric binders. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, particulate polymeric binders can have a backbone comprising multiple (at least two) urethane moieties. Such polymeric binders generally have a number average molecular weight ($M_n$) of at least 2,000 and typically at least 100,000 and up to and including 500,000, or at least 100,000 and up to and including 300,000, as determined by Gel Permeation Chromatography.

Other useful polymeric binders are particulate poly(urethane-acrylic) hybrids that are distributed (usually uniformly) throughout the imageable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more poly(urethane-acrylic) hybrids can also be used. Some polyurethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the polyurethane-acrylic) hybrid particles in a suitable aqueous medium that can also include commercial surfactants, anti-foaming agents, dispersing agents, anti-corrosive agents, and optionally pigments and water-miscible organic solvents.

Still other useful polymeric binders can be homogenous, that is, film-forming, non-particulate, or dissolvable in the coating solvent. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), U.S. Pat. No. 8,119,331 (Baumann et al.), and U.S. Pat. No. 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Useful are random copolymers derived from polyethylene glycol methacrylate/-acrylonitrile/styrene monomers in random fashion and in particulate form, dissolved random copolymers derived from carboxyphenyl methacrylamide/-acrylonitrile/methacrylamide/N-phenyl maleimide, random copolymers derived from polyethylene glycol methacrylate/acrylonitrile/vinyl carbazole/styrene/-methacrylic acid, random copolymers derived from N-phenyl maleimide/-methacrylamide/methacrylic acid, random copolymers derived from urethane-acrylic intermediate A (the reaction product of p-toluene sulfonyl isocyanate and hydroxyl ethyl methacrylate)/acrylonitrile/N-phenyl maleimide, and random copolymers derived from N-methoxymethyl methacrylamide/-methacrylic acid/acrylonitrile/n-phenylmaleimide.

The polymeric binders also can be selected from any alkaline solution soluble (or dispersible) polymer having an acid value of at least 20 meq KOH/g of polymer and up to and including 400 meq KOH/g of polymer. The following described polymeric binders are useful in the manner but this is not an exhaustive list:

I. Film-forming polymers formed by polymerization of a combination or mixture of (a) (meth)acrylonitrile, (b) poly (alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.). Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.). Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. Such polymeric binders are described in more detail in U.S. Publication No. 2008-0280229 (Tao et al.).

IV. Film-forming polymers that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.). Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.).

V. Film-forming polymers that have pendant 1H-tetrazole groups as described in U.S. Publication No. 2009-0142695 (Baumann et al.).

VI. Still other useful polymeric binders can be film-forming or exist as discrete particles and include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.). Also useful are the vinyl carbazole polymers described in U.S. Pat. No. 7,175,949 (Tao et al.). Other useful polymeric binders are particulate poly(urethane-acrylic) hybrids that are distributed (usually uniformly) throughout the imageable layer. Each of these hybrids has a molecular weight ($M_a$) of at least 50,000 and up to and including 500,000 and the particles have an average particle size of at least 10 nm and up to and including 10,000 nm (typically at least 30 nm and up to and including 500 nm), as determined by Gel Permeation Chromatography.

The total polymeric binders are provided in the negative-working imageable layer an amount of at least 20 weight % and up to and including 70 weight %, or typically at least 30 weight % and up to and including 60 weight %, based on the total dry negative-working imageable layer weight (or total solids of the corresponding coating formulation).

The negative-working radiation-sensitive composition (and negative-working imageable layer) comprises one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane(meth)acrylates or urethane(meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569, 603 (Furukawa), and U.S. Pat. No. 6,893,797 (Munnelly et al.). Other useful free radically polymerizable components include those described in U.S. Publication No. 2009/0142695 (Baumann et al.), which radically polymerizable components include 1H-tetrazole groups.

The negative-working radiation-sensitive composition (negative-working imageable layer) also includes an initiator composition that includes one or more initiators that are capable of generating free radicals sufficient to initiate polymerization of all the various free radically polymerizable components upon exposure of the composition to imaging radiation. The initiator composition is generally responsive, for example, to electromagnetic radiation in the desired spectral regions, for example in the broad infrared spectral range of at least 250 nm and up to and including 1400 nm. In some embodiments, the initiator composition is responsive to infrared radiation of at least 750 nm and up to and including 1400 nm or at least 750 nm and up to and including 1250 nm. In other embodiments, the initiator composition is responsive to exposing radiation in the UV, violet, and visible region of at least 250 nm and up to and including 550 nm and typically of at least 350 nm and up to and including 500 nm. The initiator composition can be designed for any of the noted infrared radiation exposures.

For example, the initiator composition can includes one or more electron acceptors and one or more co-initiators that are capable of donating electrons, hydrogen atoms, or a hydrocarbon radical.

In general, suitable initiator compositions include but are not limited to, aromatic sulfonylhalides, trihalogenomethylsulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. No. 4,565,769 (Dueber et al.) and U.S. Pat. No. 3,445,232 (Shirey) and can be prepared according to known methods, such as the oxidative dimerization of triarylimidazoles.

Useful initiator compositions for infrared radiation-sensitive compositions include onium compounds (salts) including ammonium, sulfonium, iodonium, diazonium, and phosphonium compounds, particularly in combination with infrared radiation-sensitive cyanine dyes. Useful iodonium cations are well known in the art including but not limited to, U.S. Publication No. 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl) [4-(2-methylpropyl) phenyl]-moiety and a suitable negatively charged counterion.

Iodonium cations can be supplied as part of one or more iodonium salts, and the iodonium cations can be supplied as iodonium borates also containing suitable boron-containing anions particularly in combination with infrared radiation-sensitive cyanine dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.).

Useful infrared radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl) phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis (4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043,787 (Hauck et al.) the disclosure of which is incorporated herein by reference with respect to useful initiator compositions, describes particularly diaryliodonium initiator compositions containing boron-containing anions.

Thus, in some embodiments, the initiator composition that is capable of generating free radicals upon exposure to imaging infrared radiation comprises a diaryliodonium cation and a boron-containing anion, wherein the diaryliodonium cation is represented by the following Structure (IV):

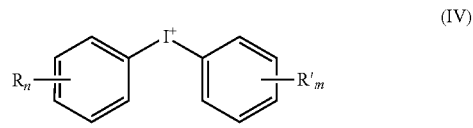

(IV)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6. The boron-containing anion is represented by the following Structure (V):

$B^-(R^1)(R^2)(R^3)(R^4)$ (V)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of initiator composition in the negative-working imageable layer would be readily apparent to one skilled in the art and would be dependent upon the particular negative-working radiation-sensitive composition to be used.

The negative-working radiation-sensitive composition and negative-working imageable layers also comprise one or more radiation absorbers such as infrared radiation absorbers or one or more UV or violet sensitizers to provide desired radiation sensitivity. The total amount of one or more radiation absorbers is at least 0.5 weight % and up to and including 30 weight %, or typically at least 1 weight % and up to and including 15 weight %, based on the negative-working imageable layer total solids.

In some embodiments, the negative-working radiation-sensitive composition contains one or more UV, violet, or visible sensitizers as radiation absorbers when the initiator composition is designed have UV, violet, or visible radiation sensitivity (that is sensitive to at least 250 nm and up to and including 550 nm), thereby facilitating photopolymerization. In other embodiments, the violet sensitizers are sensitive to "violet" radiation in the range of at least 350 nm and up to and including 550 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Publication Numbers 2006/0063101 and 2006/0234155 (both Baumann et al.), the disclosures of all of which are incorporated herein by reference for these sensitizers.

Other useful UV-sensitive sensitizers are the oligomeric or polymeric compounds having Structure (I) units defined in WO 2006/053689 (Strehmel et al.) that have a suitable aromatic or heteroaromatic unit that provides a conjugated $\pi$-system between two heteroatoms.

Additional useful "violet"-sensitive radiation absorbers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Still other useful radiation absorbers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure $G\text{-}(Ar_1)_3$ wherein $Ar_1$ is the same or different, substituted or unsubstituted carbocyclic aryl group having 6 to 12 carbon atoms in the ring, and G is a furan or oxazole ring, or the Structure $G\text{-}(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a $-N(R'_4)(R'_5)$ group, or a $-OR'_6$ group wherein $R'_4$ through $R'_6$ independently represent substituted or unsubstituted alkyl or aryl groups as defined above. At least one of $R'_1$ through $R'_3$ is an $-N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation absorbers includes compounds represented by the Structure $Ar_1\text{-}G\text{-}Ar_2$ wherein $Ar_1$ and $Ar_e$ are the same or different substituted or unsubstituted aryl groups having 6 to 12 carbon atoms in the ring, or $Ar_e$ can be an arylene-G-$Ar_1$ or arylene-G-$Ar_2$ group, and G is a furan, oxazole, or oxadiazole ring. $Ar_1$ is the same as defined above, and $Ar_e$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.).

In many embodiments of this invention, the method is carried out using a negative-working radiation-sensitive imageable layer that is sensitive (or sensitized) to near-infrared or infrared radiation having a wavelength of at least 750 nm.

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are also described, for example, in U.S. Pat. No. 7,452,638 (Yu et al.), and U.S. Publication Numbers 2008/0254387 (Yu et al.), 2008/0311520 (Yu et al.), 2009/0263746 (Ray et al.), 2010/0021844 (Yu et al.), 2013/0758573 (Balbinot et al.), and 2014/0045118 (Balbinot et al.).

Thus, the radiation absorber can be an infrared radiation absorber and the negative-working imageable layer can be sensitive to infrared radiation in many embodiments. In other embodiments, the radiation absorber (sensitizer) is sensitive to UV or violet radiation and renders the negative-working imageable layer UV or violet sensitive.

The negative-working imageable layer used in this invention can also include a poly(alkylene glycol) or an ether or ester thereof that has a molecular weight of at least 200 and up to and including 4000.

Additional additives to the negative-working imageable layer include color developers or acidic compounds. Color developers are meant to include monomeric phenolic compounds, organic acids or metal salts thereof, oxybenzoic acid esters, acid clays, and other compounds described for example in U.S. Publication No. 2005/0170282 (Inno et al.). The negative-working imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The negative-working imageable layer also optionally includes a phosphate (meth)acrylate having a molecular weight generally greater than 250 as described in U.S. Pat. No. 7,429,445 (Munnelly et al.).

Hydrophilic Overcoat

The negative-working lithographic printing plate precursor can have an outermost hydrophilic overcoat (or oxygen-barrier layer) disposed directly on the negative-working imageable layer (no intermediate layers between these two layers). When present, this hydrophilic overcoat is generally the outermost layer of the precursor and thus, when stacked with other precursors, this outermost hydrophilic overcoat of one precursor would be in contact with the backside of the substrate of the adjacent precursor above it.

Such hydrophilic overcoats can comprise one or more film-forming water-soluble polymeric binders in an amount of at least 60 weight % and up to and including 98 weight %, based on the total dry weight of the hydrophilic overcoat.

Such film-forming water-soluble (or hydrophilic) polymeric binders generally include a modified or unmodified poly(vinyl alcohol) having a saponification degree of at least 30%, or a degree of at least 75%, or a degree of at least 90%, and a degree of up to and including 99.9%.

For example, the hydrophilic overcoat can include one or more film-forming water-soluble polymeric binders that comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, phosphoric acid ester, and glycol groups.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly(vinyl alcohol), carboxylic acid-modified poly(vinyl alcohol), and quaternary ammonium salt-modified poly(vinyl alcohol), glycol-modified poly(vinyl alcohol), or combinations thereof. Specific commercial examples of the acid-modified poly(vinyl alcohol) include SD 1000 that is available from Kuraray, and Gohsefimer K-210, Gohseran L-3266, Nichigo G-Polymer AZF8035, and Gohseran CKS-50 that are available from Nippon Gohsei.

The hydrophilic overcoat can further comprise one or more other film-forming water-soluble polymers that are not poly(vinyl alcohol)s for example in an amount of at least 2 weight % and up to and including 40 weight %, of a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

The hydrophilic overcoat formulations can also include cationic, anionic, amphoteric, or non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Publication Numbers 2005/0266349 (Van Damme et al.), 2007/0231739 (Koizumi), 2007/0231740 (Yanaka et al.), and 2011/0053085 (Huang et al.).

The hydrophilic overcoat is generally present at a dry coating coverage of at least 0.1 $g/m^2$ and up to but less than 4 $g/m^2$, and typically at a dry coating coverage of at least 0.15 $g/m^2$ and up to and including 2.5 $g/m^2$. In some embodiments, the dry coating coverage is at least 0.1 $g/m^2$ and up to and including 1.5 $g/m^2$ or at least 0.1 $g/m^2$ and up to and including 0.9 $g/m^2$, such that the hydrophilic overcoat layer is relatively thin for easier removal during off-press development when a separate prewash step is used after imagewise exposure.

The hydrophilic overcoat can optionally comprise organic wax particles dispersed, generally uniformly, within the one or more film-forming water-soluble (or hydrophilic) polymeric binders as described for example in U.S. Publication No. 2013/0323643 (Balbinot et al.) the disclosure of which is incorporated herein by reference. These organic wax particles are generally present in an amount of at least 0.05 weight % and up to and including 20 weight %, or in an amount of at least 0.5 weight % and up to and including 10 weight %, all based on the total dry hydrophilic overcoat weight. Useful organic wax particles can be prepared using known procedures as described for example, in WO96/010599 (Soler Codina). Some useful fluorinated and non-fluorinated hydrocarbon wax particles can also be purchased from a number of commercial sources such as Mitsui Chemical Inc. or Münzing Liquid Technologies GmbH.

Negative-Working Lithographic Printing Plate Precursors

The negative-working radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable support. Typically, the negative-working radiation-sensitive composition is applied and dried to form a negative-working imageable layer.

Illustrative of such manufacturing methods is mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and negative-working imageable layer formulations are described in the Invention Examples below. After proper drying, the coating weight of the negative-working imageable layer is generally at least 0.1 g/m$^2$ and up to and including 5 g/m$^2$ or at least 0.5 g/m$^2$ and up to and including 3.5 g/m$^2$.

Distinct non-imageable layers can also be present under the negative-working imageable layer to enhance developability or to act as thermal insulating layers.

Optionally, a suitable hydrophilic overcoat layer formulation (as described above) can be applied to a dried negative-working imageable layer in a suitable manner, generally out of an aqueous solvent, and then dried as described below.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art, and interleaf papers can be present between the adjacent precursors in the stacks, or in some embodiments, such interleaf papers can be omitted.

Imaging Conditions

During use, a negative-working lithographic printing plate precursor is exposed to a suitable source of exposing radiation depending upon the radiation absorber present in the negative-working radiation-sensitive composition to provide specific sensitivity that is at a wavelength of at least 250 nm and up to and including 550 nm ("UV", "violet", and "visible" regions of the electromagnetic spectrum) or infrared of at least 750 nm and up to and including 1400 nm. In some embodiments, imagewise exposure is carried out using radiation having a $\lambda_{max}$ within the range of at least 250 nm and up to and including 500 nm when the negative-working lithographic printing plate precursor is sensitive to UV or "violet" radiation, or using radiation having a $\lambda_{max}$ within the range of at least 750 nm and up to and including 1400 nm using an appropriate energy source when the negative-working lithographic printing plate precursor is sensitive (or sensitized) to infrared radiation.

Thus, in some embodiments, the method of this invention utilizes a negative-working lithographic printing plate precursor that is sensitive to infrared radiation and it is imagewise exposed using infrared radiation at a wavelength of at least 750 and up to and including 1400 nm.

In other embodiments, the method of this invention utilizes a negative-working lithographic printing plate precursor that is sensitive to radiation having a wavelength of at least 250 nm and up to and including 550 nm, and it is imagewise exposed using radiation at a wavelength of at least 250 and up to and including 550 nm.

For example, imaging can be carried out using imaging or exposing radiation from a radiation-generating laser (or array of such lasers). Imaging also can be carried out using imaging radiation at multiple wavelengths at the same time if desired. The laser used to expose the negative-working lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the negative-working lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the negative-working imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV or violet region (for example at least 250 nm and up to and including 550 nm), can be carried out generally using energies of at least 0.01 mJ/cm$^2$ and up to and including 0.5 mJ/cm$^2$, and typically at least 0.02 mJ/cm$^2$ and up to and including about 0.1 mJ/cm$^2$. It would be desirable, for example, to image the UV/violet radiation-sensitive precursors at a power density in the range of at least 0.5 kW/cm$^2$ and up to and including 50 kW/cm$^2$ and typically of at least 5 kW/cm$^2$ and up to and including 30 kW/cm$^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488, 025 (Martin et al.). Thermal print heads are commercially available (for example, a Fujitsu Thermal Head FTP-040 MCS001 and TDK Thermal Head F415 HH7-1089).

Processing and Printing

After imagewise exposing, the imaged negative-working lithographic printing plate precursors is processed "off-press" using a suitable one or more successive applications (treatments or developing steps) of a processing solution according to this invention as described below. Such one or more successive processing treatments (for example, two successive processing treatments) are carried out with exposed precursors for a time sufficient to remove the non-exposed regions of the imaged negative-working imageable layer and outermost hydrophilic overcoat, if present, to reveal the hydrophilic surface of the substrate, but not long enough to remove significant amounts of the exposed regions that have been hardened. The revealed hydrophilic substrate surface repels inks while the exposed regions accept lithographic printing ink. Thus, the non-exposed regions to be removed are "soluble" or "removable" in the processing solution because they are removed, dissolved, or dispersed within it more readily than the regions that are to remain. The term "soluble" can also mean "dispersible".

Prior to such processing, the exposed precursors can be subjected to a "pre-heating" process to further harden the exposed regions in the negative-working imageable layer. Such optional pre-heating can be carried out using any known process or equipment and is generally at a temperature of at least 60° C. and up to and including 180° C.

Following this optional pre-heating, or in place of the pre-heating, the exposed precursor can be washed (rinsed) to remove any hydrophilic overcoat that is present. Such optional washing (or rinsing) can be carried out using any suitable aqueous solution (such as merely water or an aqueous solution of a surfactant) at a suitable temperature and for a suitable time that would be readily apparent to one skilled in the art.

One or more successive treatments by processing (development) off-press can be accomplished using what is known as "manual" development, "dip" development, or processing with an automatic development apparatus (processor) using one or more processing stations. In the case of "manual" development, processing can be conducted by rubbing the entire exposed precursor with a sponge or cotton pad sufficiently impregnated with the processing solution (as described below). "Dip" development involves dipping the exposed precursor in a tank or tray containing a processing solution for at least 10 seconds and up to and including 60 seconds (especially at least 20 seconds and up to and including 40 seconds) under agitation. The use of automatic development apparatus is well known and generally includes pumping a processing solution into a developing tank or ejecting it from spray nozzles. The apparatus can also include a suitable rubbing mechanism (for example one or more brushes or rollers) and a suitable number of conveyance rollers. Some developing apparatus include laser exposure means and the apparatus is divided into an imaging section and one or more processing sections. Manual processing is less desirably that use of a processing apparatus of some type.

Thus, a processing solution can be applied in one or more successive applications to an exposed precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the exposed precursor with the processing solution or contacting it with a roller, impregnated pad, or applicator. For example, the exposed precursor can be brushed with one or more successive applications of a processing solution, or a processing solution can be successively poured onto or applied by spraying the exposed precursor surface with sufficient force to remove the non-exposed regions using a spray nozzle system (or spray bar) as described for example in [0124] of EP 1,788,431A2 (noted above) and U.S. Pat. No. 6,992,688 (Shimazu et al.). As noted above, the exposed precursor can be immersed in one or more successive baths of a processing solution and rubbed by hand or with an apparatus. To assist in the removal of any back side coating, a brush roller or other mechanical component can be placed in contact with the back side coating during processing.

The processing solution can be successively applied to the exposed precursor in one or more successive processing units (or stations) of a suitable processing apparatus ("processor") that has at least one brush roller for rubbing or brushing the exposed precursor. Residual processing solution can be removed for example, using a squeegee or nip rollers, or left on the resulting lithographic printing plate without any rinsing step. Excess amounts of processing solution can be collected in a tank and used several times, and replenished if necessary from a reservoir.

The processing solution can be replenished using any suitable means and at a desired time. In the case of dip tank and spray bar arrangements in processing apparatus, the processing solution can be replenished with replenisher having the same concentration of the original processing solution. It is also possible to replenish the processing solution with a more concentrated or more dilute form of the processing solution. Another option is to replenish the processing solution with water. The chosen method of replenishment depends upon the type of exposed precursor to be processed, the chosen processing solution (for example, chosen buffer capacity, solids content, viscosity, and other properties), and the construction of the processing apparatus (for example, amount of evaporation in a given processing mode or use of preheating).

One or multiple (for example two) successive processing steps can be carried out at any suitable temperature and "dwell time" (time of contact with the processing solution in one or more processing stations). For example, the exposed precursor can be contacted with a processing solution described below, each individual (distinct) application or contact being carried out independently at a temperature of at least 20° C. and up to and including 40° C. Each individual contacting or treatment can be carried out, for example, in a dip tank or spray bar processor at a temperature of at least 20° C. and up to and including 40° C. optionally while using at least one rotating brush in each processing station.

It is useful to carry out each of multiple successive applications (for example two successive applications) of the processing solution to the exposed precursor in a dip tank arrangement (for example, arranged with 1 to 3 mechanical brush rollers), using of a spray bar arrangement (for example, arranged with 1 to 3 mechanical brush rollers), or by applying a processing solution using contact with rubber rollers without brush rollers. Hot air drying can be used after the last application of processing solution before being mounting the lithographic printing plate onto a printing press. As noted below, there can be drying operations (such as using hot air)

between each pair of multiple successive applications, such as between two successive applications when only two successive applications are used.

For example, in some embodiments, a first application of processing solution can be carried out in a dip tank arrangement (for example, arranged with 1 to 3 mechanical brush rollers) followed by a second application of processing solution using a rubber roller without brush rollers. Hot air drying can be carried out between these two applications of processing solution.

When a single application of processing is used in some embodiments of the present invention, the processing solution can be applied in a dip tank arrangement (for example, arranged with 1 to 3 mechanical brush rollers) using of a spray bar arrangement (for example, arranged with 1 to 3 mechanical brush rollers), or by applying a processing solution using contact with rubber rollers without brush rollers. Hot air drying can be used after this single application of processing solution before being mounting the lithographic printing plate onto a printing press Processing Solution:

A processing solution is used to process (develop) the exposed precursor in one or more applications (one or more treatments). As noted above, in some embodiments, only one application of processing solution is used, but in other embodiments, multiple successive applications are used, for example two successive applications of the processing solutions. The term "successive" means that there are no intermediate rinsing steps between two distinct (independent) processing applications, but there can be an intermediate drying step (using hot air or other conditions described below) between any two successive applications of processing solution.

Moreover, as described in more detail below, when multiple successive applications of processing solution are used, the processing solution used in each application is defined by the essential components (1) through (4) and amounts described below. However, within those parameters, the processing solution used in a multiple applications can have the same or different amounts of the essential components (1) through (4) as the essential components (1) through (4) in another application of processing solution. More details of these conditions are provided below.

The processing solution (also be considered a "developer") has as its purpose to develop as much of the non-exposed regions of the negative-working radiation-sensitive imageable layer as possible. As noted herein, the same or different processing solution can be used multiple times if desired.

In all embodiments of the present invention, the processing solution (whether a single application or multiple applications) has a pH of at least 7 and up to and including 11, or more likely at least 9 and up to and including 11. The pH can be achieved and maintained using suitable amounts of components (1) through (4) described below, with or without additional bases or acids and then maintaining the pH using suitable buffers that would be known in the art.

The processing solution contains only four essential components, namely component (1), component (2), component (3), and component (4) as only these four components are essential for achieving the advantages described herein for the present invention. Optional materials as described below can also be present.

Component (1):

As noted above, component (1) comprises at least one nitrogen-containing base, or a mixture of such compounds. Each of such compounds is either an amine who conjugated acid has a p$K_a$ greater than 7, or an amino acid comprising one amino group and one acidic group per molecule. Such acidic groups can be carboxylic acid, sulfonic acid, or phosphonic acid groups. Moreover, each of these nitrogen-containing bases has a melting point of at least 40° C. as measured at atmospheric pressure. The melting point can be determined using known equipment and procedures such as the Differential Scanning calorimetry (DSC) or by the Thiele Tube Method.

In some embodiments, the component (1) nitrogen-containing base contains no ionic group, and in other embodiments, the component (1) nitrogen-containing base contains no carboxylic acid group. However, sometimes it is useful to include amino acids as component (1) in combination with an inorganic base such as sodium hydroxide or potassium hydroxide to provide the desired pH of the processing solution and to facilitate rapid development.

Representative component (1) compounds are selected from the group consisting of: 2-amino-2-hydroxymethylpropane-1,3-diol (TRIS), 1,3-bis(tris(hydroxymethyl)methylamino)propane (bis-tris propane), bis(2-hydroxyethyl)-amino-tris(hydroxymethyl)-methane (bis-tris), triethylene diamine, melamine, piperazine, urotropine, and poly(ethylene imine); and amino acids including but not limited to, glycine, alanine, 2-aminoethane sulfonic acid, 3-[[1,3-dihydroxy-2-(hydroxymethyl)propan-2-yl]amino]propane-1-sulfonic acid (TAPS), 3-[[1,3-dihydroxy-2-(hydroxymethyl)propan-2-yl]amino]-2-hydroxypropane-1-sulfonic acid (TAPSO), N-[tris(hydroxymethyl)methyl]glycine (Tricine), N,N-bis(2-hydroxyethyl)glycine (Bicine), 2-(N-morpholino)ethanesulfonic acid (MES), 4-(2-hydroxyethyl)-1-piperazineethanesulfonic acid (HEPES), 4-morpholinepropanesulfonic acid (MOPS), and pyrrolidone-2-carboxylic acid.

The one or more component (1) compounds are present in the processing solution in an amount of at least 1 weight %, and more likely in an amount of at least 1 weight % and up to and including 10 weight %, based on the total processing solution weight [including the weight of solvent(s)].

Component (2):

The processing solution also comprises one or more nonionic surfactants, each of which (independently) can be characterized by one or more of a three physical parameters: melting point, glass transition temperature, or pour point, each of which is at least 40° C. as measured at atmospheric pressure. The melting point can be determined as described above for component (1). Glass transition temperature ($T_g$) can be determined using known procedures such as Differential Scanning calorimetry (DSC). Pour point can be determined by a method described in the ASTM D5853 standard. These physical parameters are considered "independent" meaning that component (2) need only exhibit one of them, but can exhibit two or all three of the physical parameters.

In some embodiments of the method of the present invention, component (2) can be represented by the formula:

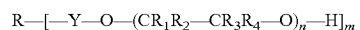

wherein:

R is a substituted or unsubstituted alkyl group having 4 to 30 carbon atoms, or a substituted or unsubstituted aryl group (such as a substituted or unsubstituted phenyl or naphthyl group). R contains no ionic groups (neither anionic nor cationic).

Moreover, $R_1$, $R_2$, $R_3$, and $R_4$ are independently hydrogen, methyl, or ethyl, and likely each of these groups is hydrogen or methyl, and more likely each is hydrogen.

In the noted component (2) formula, Y is a single bond or a divalent linking group. In most embodiments, Y is a single bond, but in other embodiments, it can be divalent groups that are substituted or unsubstituted and include a chain or any of alkylene, arylene, or carboxy [—C(=O)—] groups constructed in any desirable sequence so that the divalent group chain comprises at least 1 and up to and including 14 atoms.

Moreover, n is an integer of at least 20 and up to and including 100 or at least 20 and up to and including 50; and m is an integer of 1 and up to and including 3, but most likely, m is 1.

Component (2) is generally present in the processing solution in an amount of at least 1 weight % and up to and including 10 weight %, based on total processing solution weight [including solvent(s)], and can comprise at least 20 ethylene oxide or propylene oxide units, or a combination of both ethylene oxide and propylene oxide units.

Some representative compounds that can be used alone or in mixtures as component (2) are the following commercial materials:

Soprophor TS54 [tristyrylphenol ethoxylate (EO54)] available from Rhodia;

Soprophor T25 available from Rhodia;

Genapol® LA 230 C12/14 fatty alcohol polyglycol ether with 23 EO available from Clariant;

Genapol® T 250 powder C16/C18 fatty alcohol polyglycol ether with 25 EO available from Clariant;

Genapol® T 500 powder C16/C18 fatty alcohol polyglycol ether with 50 EO available from Clariant;

Genapol® T 800 powder C16/C18 fatty alcohol polyglycol ether with 80 EO available from Clariant;

Genapol® PF 80 powder block copolymer of EO/PO containing 80% EO 100 available from Clariant;

Genapol® PF 80 block copolymer of EO/PO containing 80% EO 100 available from Clariant;

Genapol® PF 80 FP block copolymer of EO/PO containing 80% EO 100 available from Clariant;

Emulsogen®V 2436 fatty alcohol alkoxylate 100 available from Clariant;

Emulsogen® 3510 n-butanol alkoxylate 100 available from Clariant;

Sapogenat® T 300 tri-sec-butylphenol polyglycol ether with 30 EO 100 available from Clariant; and Sapogenat® T 500 tri-sec-butylphenol polyglycol ether with 50 EO 100 available from Clariant.

Component (3):

The processing solution used in this invention further contains a hydroxy-containing solution promoter, some of which are known in the art as organic solvents. One of more of these hydroxy-containing solution promoters are present in the processing solution in a total amount of at least 0.5 weight % based on the total processing solution weight. The presence of one or more hydroxy-containing solution promoters can increase developing speed to a desired amount. The hydroxy-containing solution promoter can also act as an organic solvent for the processing solution and in such instances, the total amount of hydroxy-containing solution promoters can be up to and including 10 weight %, based on the total processing solution weight. Such hydroxy-containing solution promoters can include but are not limited to, alcohols, alkoxylated aliphatic alcohols, and alkoxylated phenols.

For example, some useful hydroxy-containing solution promoters include methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, triethylene glycol monobutylether, propylene glycol monoethyl ether, propylene glycol monoethyl ether, polyethylene glycol monomethyl ether, polypropylene glycol, tetraethylene glycol, ethylene glycol monobutyl ether, ethylene glycol monobenzyl ether, ethylene glycol monophenyl ether, methylphenylcarbinol, n-amyl alcohol, or methylamyl alcohol, ethylene glycol, propylene glycol, triethylene glycol, butylene glycol, hexylene glycol, diethylene glycol, dipropylene glycol, glycerin, trimethylol propane, diglycerin, 1-butanol, 1-pentanol, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, polyethylene glycol monomethyl ether, ethylene glycol monobutyl ether, ethylene glycol monobenzyl ether, ethylene glycol monophenyl ether, methyl phenyl carbinol, n-amyl alcohol or methylamyl alcohol, a higher alkylamine ethylene oxide adduct, a polyoxyethylene alkylamine salt, a polyethylene polyamine derivative, N-phenylethanolamine, and N-phenyldiethanolamine.

Examples of useful alkoxylated phenols are phenoxy ethanol phenoxy propanol and phenol ethoxylated with 4 to 7 ethylene oxide units.

In many embodiments, one or more of component (3) compounds are present in the processing solution in a total amount of at least 0.5 weight % and up to and including 5 weight %, based on the total processing solution weight. Such compounds can be selected from the group consisting of (a) an ethoxylated phenol or ethoxylated naphthol comprising at least 1 and up to and including 7 ethyleneoxy units, (b) an alkoxylated phenol or alkoxylated naphthol comprising at least 1 and up to and including 7 alkoxyoxy units wherein the alkoxy has 2 to 4 carbon atoms, (c) an ethyloxylated aliphatic alcohol comprising at least 1 and up to and including 7 ethyleneoxy units and an aliphatic moiety having 1 to 8 carbon atoms, and (d) and alkoxylate aliphatic alcohol comprising at least 1 and up to and including 7 alkoxylated units wherein the alkoxy has 1 to 2 to 4 carbon atoms and aliphatic moiety having 1 to 8 carbon atoms.

Component (4):

Another essential material in the processing solution is one or more hydrophilic surface protective compounds to protect the non-imaged regions of the exposed and processed precursor before it is used for lithographic printing. The one or more hydrophilic surface protective compounds are in the processing solution in an amount of at least 1 weight % and up to and including 10 weight %, based on the total processing solution weight. Component (4) can be selected from soy polysaccharides, modified starches, gum arabic, dextrin, cellulose derivatives (for example, carboxymethyl cellulose, carboxyethyl cellulose, and methyl cellulose), pullulan, a poly(vinyl alcohol), a poly(vinyl pyrrolidone), a poly(meth)acrylamide, a vinyl methyl ether/maleic anhydride copolymer, a vinyl acetate/maleic anhydride copolymer, a styrene/maleic anhydride copolymer, and a hydroxycarboxylate salt.

In some embodiments, component (4) has an acid value of 0 and up to and including 3 meq KOH/gram of component (4) wherein acid value is determined using known procedures.

Modified starches include for example, corn, potato, tapioca, rice, wheat, and other known starches that can be modified using known procedures and an acid or enzyme to provide roasted starches such as British gum. Useful enzyme-modified dextrins include enzymatically produced dextrin and Schardinger dextrin. Useful oxidized starches include solubilised starch, pre-gelatinized starches such as modified pre-gelatinized starch and unmodified pre-gelatinized starch. Useful esterified starches include starch phosphate, fatty starch, starch sulfate, starch nitrate, starch xanthate, and starch carbamate. Useful etherized starches include carboxy-alkyl starch, hydroxyalkyl starch, sulfoalkyl starch, cyanoethyl starch, allyl starch, benzyl starch, carbamylethyl starch, and dialkylamino starch. Useful crosslinked starches include methylol-crosslinked starch, hydroxyalkyl-crosslinked starch, phosphate-crosslinked starch, and dicarboxylic acid-crosslinked starch. Useful graft polymerized starches include starch/polyacrylamide copolymers, starch/polyacrylic acid copolymers, starch/polyvinyl acetate copolymers, starch/polyacrylonitrile copolymers, cationic starch/polyacrylate ester copolymers, cationic starch/vinyl polymer copolymers, starch/polystyrene/maleic acid copolymers, starch/polyethylene oxide copolymers, and starch/polypropylene copolymers. Furthermore hydroxycarboxylate salts such as those as disclosed in EP 2,354,852A1 can be used.

Optional Materials:

The processing solution can also include chelating agents (such as salts of ethylenediaminetetraacetic acid), and alkaline components (such as inorganic metasilicates, organic metasilicates, hydroxides, and bicarbonates) although such alkaline components are not particularly desirable unless used with amino acids described above. Inorganic and organic silicates and metasilicates are omitted from some processing solutions. Additional optional components of the processing solution useful in this invention include but are not limited to, antifoaming agents, buffers, biocides, complexing agents, sludge inhibitors (such as filter dyes and free-radical inhibitors), odorants, anti-corrosion agents, and dyes. Such optional components can be present in amounts that would be readily apparent to one skilled in the lithographic processing art.

The processing solution useful in the present invention does not purposely contain anionic, cationic, or amphoteric surfactants as those compounds are known in the lithographic processing art. Thus, the total amount of such compounds is generally less than 0.1 weight %, or even less than 0.05 weight %, based on the total processing solution weight.

Tap water can be used to make up the processing solution and generally provides at least 45 weight % and up to and including 98 weight % based on the total processing solution weight.

Thus, in many embodiments of this invention, one or more of the following conditions are satisfied in the processing solution (and in most embodiments, all of the following conditions are met):

component (1) is present in an amount of at least 1 weight % and up to and including 10 weight %, component (2) is present in an amount of at least 1 weight % and up to and including 10 weight %, component (3) is present in an amount of at least 0.5 weight % and up to and including 5 weight %, or component (4) is present in an amount of at least 1 and up to and including 10 weight %, all based on the total processing solution weight.

Multiple Applications of Processing Solution:

As noted above, in many embodiments of the present invention, the exposed precursor is contacted (treated) with multiple applications of the same or different processing solution. In many of these particular embodiments, the same processing solution is used in each application to the exposed precursor and thus having the same ratio of components (1) through (4) in the processing solution used in each successive application.

However, in other multiple successive applications of the processing solution, for example, when there are two successive applications of the processing solution, each application is carried out with a processing solution having the essential components (1) through (4), but the concentration of one or more of these components can be different between successive applications of processing solutions. In other words, the ratio of one or more of the components (1) through (4) is different between successive applications of processing solution. Moreover, the specific chemical compounds used to supply components (1) through (4) can be the same or different in the successively used processing solutions.

It is possible, for example, to have successive applications of processing solution wherein there is a steady reduction in component (1) through component (4) concentrations in later applications compared to the immediately preceding application.

It is also possible for the processing solution in a following application to be cascaded into the processing solution used in a preceding application. This cascading principle can be used in as many application stages as possible.

When an automatic processing apparatus is used for processing exposed precursors, the processing solution is typically re-used to treat a plurality of exposed precursors. Under such a circumstance, the processing solution in a tank from a previous use (application) contains higher amounts of materials removed from the exposed precursors than the processing solution in a tank for a following use or application. Thus it is possible to use the processing solution from a following application to replenish the processing solution in the previous application. This can be done in a cascading manner where the processing solution in the tank for the following application overflows into the tank for the previous application. This can also be done by re-circulating the processing solution in the tanks for the previous application and the following application with their respective reservoirs and then drawing the processing solution from the reservoir for the following processing solution to replenish the processing solution in the tank or the reservoir for the previous application. Further details about such arrangements in processing systems would be readily apparent to one skilled in the art.

For example, in some embodiments using two successive applications of processing solutions, it is desirable to have a lower concentration of one or more of components (1) through (4) in the later applications of processing solution compared to the preceding application. For example, a successive application can use a processing solution with lower concentrations of all of components (1) through (4) compared to the processing solution used in the immediately previous application. In one such embodiment, a first application uses a processing solution in which all of component (1) through component (4) is present in an amount that is greater (for example, at least 20 weight % more or even at least 50 weight % more) than the corresponding component (1) through component (4) in a second application of the processing solution. The actual compounds used in each successive application of processing solution can be the same or different as long as the concentrations of the components are different between the two applications of processing solutions. The processing solution used in the second application can be obtained by diluting the processing solution used in the first application.

Each application of processing solution, including the multiple successive applications can be carried out using the same or different apparatus, processing tanks, brushes, temperature, and dwell time as described above, but in many instances, the processing apparatus, technique, temperature, and dwell time are similar for each application of processing solution.

Thus, each application can be carried out can be carried out in a dip tank or by using a spray bar processor at a temperature of at least 20° C. and up to and including 40° C., optionally while using at least one rotating brush.

It is essential, however, that between any two successive applications of processing solutions, there are no rinsing or gumming steps. There can be a drying process between each two successive applications, and drying conditions can be the same or different from those described below that is carried out after the last application of processing solution. However, such drying procedures between successive applications are not required.

Post-Processing Operations:

It is optional but desirable in some embodiments that the exposed and processed precursor is dried before it is mounted on a printing press. Drying can be accomplished using any suitable method and drying means such as using hot air at a temperature of at least 40° C. and up to and including 150° C., or a drying oven maintained as a suitable temperature. The drying means can be a distinct section or station in a processing apparatus, or it can be a separate apparatus.

After the described processing and optional drying, the resulting lithographic printing plate can be mounted onto a printing press without any contact with additional solutions or liquids. It is particularly advantageous that the traditional separate gumming and rinsing operations can be avoided between the last application of processing solution and mounting the resulting lithographic printing plate onto a printing press for lithographic printing.

It is optional to further bake the lithographic printing plate with or without blanket or floodwise exposure to UV or visible radiation. Alternatively, a blanket UV or visible radiation exposure can be carried out, without a postbake operation. Postbaking the exposed and processed lithographic printing plate can be carried out at a temperature of at least 180° C. for at least 10 seconds or at a temperature of at least 180° C. and up to and including 300° C. for at least 10 seconds and up to and including 10 minutes.

Printing:

Printing can be carried out by putting the exposed and processed lithographic printing plate on a suitable printing press. The lithographic printing plate is generally secured in the printing press using suitable clamps or other holding devices. Once the lithographic printing plate is secured in the printing press, printing is carried out by applying a lithographic printing ink and fountain solution to the printing surface of the lithographic printing plate in a suitable manner. The fountain solution is taken up by the surface of the hydrophilic substrate revealed by the exposing and processing steps, and the lithographic ink is taken up by the remaining (exposed) regions of the imageable layer. The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to the receiving material (for example, sheets of paper). The lithographic printing plates can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A method for preparing a lithographic printing plate, the method comprising:

(a) imagewise exposing a negative-working lithographic printing plate precursor comprising a substrate having disposed thereon a negative-working radiation-sensitive imageable layer, and optionally, a hydrophilic overcoat disposed on the negative-working radiation-sensitive imageable layer, to provide an exposed precursor comprising exposed regions and non-exposed regions in the negative-working radiation-sensitive imageable layer;

(b) optionally heating the exposed precursor to a temperature of at least 60° C. and up to and including 180° C.;

(c) optionally washing the exposed precursor to remove the hydrophilic overcoat;

(d) treating the exposed precursor with one or more successive applications of a processing solution to provide an exposed and processed precursor, the processing solution having a pH of at least 7 and up to and including 11 and comprising:

component (1) that is a nitrogen-containing base having an atmospheric pressure melting point of at least 40° C., and is present in an amount of at least 1 weight % based on the total processing solution weight;

component (2) that is a non-ionic surfactant that independently has an atmospheric pressure melting point, glass transition temperature, or pour point of at least 40° C., and is present in an amount of at least 1 weight % based on the total processing solution weight;

component (3) that is a hydroxy-containing solution promoter that is present in an amount of at least 0.5 weight % based on the total processing solution weight; and component (4) that is a hydrophilic surface protective compound that can be present in an amount of at least 1 weight % based on the total processing solution weight;

(e) optionally, drying the exposed and processed precursor; and (f) mounting the exposed and processed precursor on a printing press, with the proviso that the exposed precursor is not further treated with any liquid between (d) and (f).

2. The method of embodiment 1, wherein component (1) contains no ionic group.

3. The method of embodiment 1 or 2, wherein component (1) contains no carboxylic acid group.

4. The method of any of embodiments 1 to 3, wherein component (1) is present in the processing solution in an amount of at least 1 weight % and up to and including 10 weight %, based on total processing solution weight, and component (1) is selected from the group consisting of:

2-amino-2-hydroxymethyl-propane-1,3-diol, 1,3-bis(tris(hydroxymethyl)methylamino)propane, bis(2-hydroxyethyl)-amino-tris(hydroxymethyl)-methane, triethylene diamine, melamine, piperazine, urotropine, poly(ethylene imine), glycine, alanine, 2-aminoethane sulfonic acid, 3-[[1,3-dihydroxy-2-(hydroxymethyl)propan-2-yl]amino]propane-1-sulfonic acid, 3-[[1,3-dihydroxy-2-(hydroxymethyl)propan-2-yl]amino]-2-hydroxypropane-1-sulfonic acid, N-[tris(hydroxymethyl)methyl]glycine, N,N-bis(2-hydroxyethyl)glycine, 2-(N-morpholino)ethanesulfonic acid, 4-(2-hydroxyethyl)-1-piperazineethanesulfonic acid, 4-morpholinepropanesulfonic acid, and pyrrolidone-2-carboxylic acid.

5. The method of any of embodiments 1 to 4, wherein component (2) is represented by the formula:

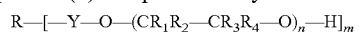

$$R-[-Y-O-(CR_1R_2-CR_3R_4-O)_n-H]_m$$

wherein:

R is a substituted or unsubstituted alkyl group or substituted or unsubstituted aryl group, provided R contains no ionic group;

$R_1$, $R_2$, $R_3$, and $R_4$ are independently hydrogen, methyl, or ethyl;

Y is a single bond or a divalent linking group;

n is an integer of at least 20 and up to and including 100; and m is an integer of 1 and up to and including 3.

6. The method of any of embodiments 1 to 5, wherein component (2) is present in the processing solution in an amount of at least 1 weight % and up to and including 10 weight %, based on total processing solution weight, and component (2) comprises at least 20 ethylene oxide or propylene oxide units.

7. The method of any of embodiments 1 to 6, wherein component (3) is present in the processing solution in an amount of at least 0.5 weight % and up to and including 5 weight %, based on the total processing solution weight, and component (3) is selected from the group consisting of (i) an ethoxylated phenol or ethoxylated naphthol comprising at least 1 and up to and including 7 ethyleneoxy units, (ii) an alkoxylated phenol or alkoxylated naphthol comprising at least 1 and up to and including 7 alkoxyoxy units wherein the alkoxy has 2 to 4 carbon atoms, (iii) an ethyloxylated aliphatic alcohol comprising at least 1 and up to and including 7 ethyleneoxy units and an aliphatic moiety having 1 to 8 carbon atoms, and (iv) and alkoxylate aliphatic alcohol comprising at least 1 and up to and including 7 alkoxylated units wherein the alkoxy has 1 to 2 to 4 carbon atoms and aliphatic moiety having 1 to 8 carbon atoms.

8. The method of any of embodiments 1 to 7, wherein, one or more of the following conditions are met in the processing solution:

component (1) is present in an amount of at least 1 weight % and up to and including 10 weight %, component (2) is present in an amount of at least 1 weight % and up to and including 10 weight %, component (3) is present in an amount of at least 0.5 weight % and up to and including 5 weight %, or component (4) is present in an amount of at least 1 and up to and including 10 weight %, all based on the total processing solution weight.

9. The method of any of embodiments 1 to 8, wherein component (4) is present in the processing solution in an amount of at least 1 weight % and up to and including 10 weight %, based on the total processing solution weight, and component (4) is selected from soy polysaccharides, modified starches, gum arabic, dextrin, cellulose derivatives, pullulan, a poly(vinyl alcohol), a poly(vinyl pyrrolidone), a poly (meth)acrylamide, a vinyl methyl ether/maleic anhydride copolymer, a vinyl acetate/maleic anhydride copolymer, a styrene/maleic anhydride copolymer, and a hydroxycarboxylate salt.

10. The method of any of embodiments 1 to 9, wherein component (4) has an acid value of 0 and up to and including 3 meq KOH/gram of component (4).

11. The method of any of embodiments 1 to 10, comprising treating the exposed precursor with two successive applications of the processing solution.

12. The method of any of embodiments 1 to 11, comprising treating the exposed precursor with two successive applications of the processing solution, wherein in the first of the two successive applications of processing solution, the processing solution comprises components (1) to (4), but at least one of the components (1) to (4) is present at a concentration that is greater than the corresponding component (1) to (4) in the processing solution used in the second of the two successive applications of processing solutions.

13. The method of any of embodiments 1 to 12, wherein each of the one or more successive applications of the processing solutions is carried out in a dip tank or spray bar processor at a temperature of at least 20° C. and up to and including 40° C., and optionally while using at least one rotating brush.

14. The method of any of embodiments 1 to 13, wherein after treating the exposed precursor with the one or more successive applications of the processing solution, (d) drying the exposed precursor with hot air at a temperature of at least 40° C. and up to and including 150° C.

15. The method of any of embodiments 1 to 14, comprising between each of two successive applications of the processing solution, drying the exposed and processed precursor with hot air at a temperature of at least 40° C. and up to and including 150° C.

16. The method of any of embodiments 1 to 15, wherein the negative-working radiation-sensitive imageable layer is sensitized to near-infrared or infrared radiation having a wavelength of at least 750 nm.

17. The method of any of embodiments 1 to 15, wherein the negative-working radiation-sensitive imageable layer is sensitized to violet or visible radiation having a wavelength of at least 250 nm and up to and including 550 nm.

18. The method of any of embodiments 1 to 17, consisting essentially of (a) through (f), wherein (f) is carried out using hot air.

19. The method of embodiment 18, consisting essentially of (a) through (f), wherein (d) treating is carried out with two successive applications of the same processing solution.

The following Examples are provided to illustrate the practice of this invention and are not meant to be limiting in any manner. The following components were used in the Examples.

| | |
|---|---|
| Aerodisp ® 1030 | 30 weight % dispersion of surface modified silica particles in methoxypropylacetate (EVONIK, Germany) |
| Acticide ® LA 1206 | A biocide (Thor Specialties, Inc.) |
| Binder 1 | Copolymer derived from methacrylic acid, allyl methacrylate, and benzyl methacrylate, 20/60/20 molar ratio |
| Binder 2 | Copolymer derived from methacrylic acid, methyl methacrylate, allyl methacrylate, and N-isopropyl methacrylamide, 20/20/40/20 molar ratio |
| CIB | Bis-cumyliodonium tetraphenylborate |
| BLO | γ-Butyrolactone solvent |
| BYK ® 307 | Polyethoxylated dimethyl polysiloxane (BYK Chemie) |
| o-Cl-HABI | 2,2'-Bis(2-chlorophenyl)-4,4',5,5'-tetraphenyl-1,1'-biimidazole |
| Dowanol ® EPH | Phenoxyethanol solvent (Dow Chemical) |
| Dowanol ® PM | Propylene glycol monomethylether solvent (Dow Chemical) |
| Emulsogen ® TS160 | 2,4,6-Tri(1-phenylethyl)-phenol polyglycol ether with 16 ethylene oxide units (Clariant) |
| Emulsogen ® TS 290 | Tristyrylphenol-polyglycol with approximately 29 moles of ethylene oxide units (Clariant) |

-continued

| | |
|---|---|
| Ethylan HB4 | Tetraethylene glycol mono phenyl ether |
| Foam Ban HV825G | Antifoaming agent containing a polyalkylene glycol (Muenzing) |
| Genapol ® T500 | $C_{16/18}$ alcohol ethoxylate (Clariant) |
| Hybridur ® 580 | Polyurethane acrylic hybrid dispersion in water, 40% solids (Air Products) |
| IR Dye | 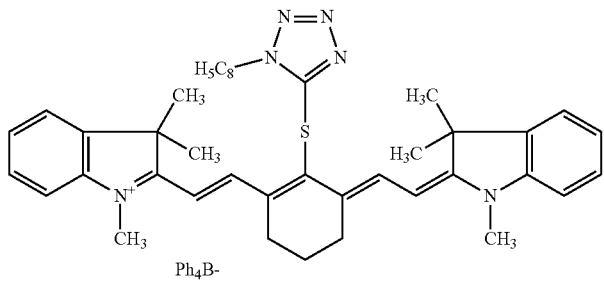 |
| Lugalvan ® BNO 12 | Ethoxylated β-naphthol with 12 ethylene oxide units (BASF) |
| Lugalvan ® BNO 24 | Ethoxylated β-naphthol with 24 ethylene oxide units (BASF) |
| Lutensol ® T0109 | Ethoxylated (10 ethylene oxide units) $C_{13}$ alcohol (available from BASF Corporation) |
| MEK | Methyl ethyl ketone |
| Monomer 1 | Urethane methacrylate made from glycerol dimethacrylate, glycerol monomethacrylate, propylene glycol methacrylate, and biuret of hexamethylene diisocyanate corresponding to oligomer m1 described in EP 1,969,426B1 |
| Monomer 2 | Hyperbranched polyester acrylate CN2302 (Sartomer) |
| Newcol B13 | Ethoxylated β-naphthol with 10 ethylene oxide units (Nippon Nyukazai Co., Ltd.) |
| Sipomer ® PAM-100 | Phosphate functionalized methacrylate with polyalkylene oxide spacer (Rhodia) |
| Tris | 2-Amino-2-hydroxymethyl-propane-1,3-diol |
| Kayamer PM-2 | Ester of hydroxyethyl methacrylate and phosphoric acid (Rhodia) |
| NK Ester BPE 500 | Ethoxylated Bisphenol A dimethacrylate (Shin Nakamura) |
| PGME | Propylene glycol monomethyl ether |
| Pigment 1 | Dispersion in propylene glycol monomethyl ether containing 9 weight % of copper phthalocyanine and 1 weight % of a poly(vinyl acetal) binder containing 39.9 mol % of vinyl alcohol, 1.2 mol % of vinyl acetate, 15.4 mol % of acetal groups from acetaldehyde, 36.1 mol % of acetal groups from butyraldehyde, and 7.4 acetal groups from 4-formylbenzoic acid |
| Pigment 2 | Dispersion in propylene glycol monomethyl ether containing 9 weight % of heligogene blue 7565 and 4 weight % of a poly(vinyl acetal) binder containing 39.9 mol % of vinyl alcohol, 1.2 mol % of vinyl acetate, 15.4 mol % of acetal groups from acetaldehyde, 36.1 mol % of acetal groups from butyraldehyde, and 7.4 acetal groups from 4-formylbenzoic acid |
| PVA1 | Gohseran L-3266 (PVA with sulfonic acid groups, saponification degree 88%) (Nippon Gohsei) |
| PVA2 | Nichigo G-Polymer AZF 8035, saponification degree 99% (Nippon Gohsei) |
| PVP K-15 | Poly(vinyl pyrrolidone) (ISP) |
| Sensitizer 1 | 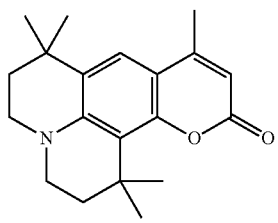 [SMILES: Cc1cc(=O)oc2c3c4c(cc12)C(C)(C)CCN4CCC3(C)C] |
| Sokalan Luvitec VPC 55K 65W | Vinyl pyrrolidone/vinyl caprolactam copolymer (50/50 mol %) (BASF) |

-continued

| | |
|---|---|
| Soprophor ® TS54 | Tristyrylphenol ethoxylate (54 ethylene oxide units) (Rhodia) |
| SR399 | Dipentaerythritol pentaacrylate (Sartomer) |
| Surfynol ® 440 | Ethoxylated 2,4,7,9-tetramethyl-5-decyn-4,7-diol (Air Products) |

Preparation of Lithographic Printing Plate Precursors P1 Sensitized for 830 nm Exposure:

An electrochemically roughened and anodized aluminum foil with an aluminum oxide weight of 2.75 g/m² was subjected to a post-treatment using an aqueous solution of poly(vinyl phosphoric acid). The average roughness of the resulting hydrophilic surface of this substrate was 0.55 µm.

An imageable layer coating composition having the components shown in TABLE I below was disposed onto the substrate after filtering using a wire bar coater. The coating was dried for 4 minutes at 90° C. to provide a dry imageable layer coating weight of 1.4 g/m².

A hydrophilic overcoat composition having the components shown in TABLE II below was applied to each imageable layer, and dried for 4 minutes at 90° C. to provide a dry coating weight of 1.5 g/m².

TABLE I

Imageable Layer Composition Coated as 14 weight % Solution in Dowanol ® PM/MEK (4/1)

| | Solids Content (%) |
|---|---|
| Binder 1 | 36.5 |
| Pigment 1 | 6.0 |
| Monomer 1 | 20.1 |
| Monomer 2 | 20.1 |
| PAM-100 | 3.0 |
| CIB | 2.5 |
| IR Dye | 1.5 |
| Aerodisp ® 1030 | 10.0 |
| BYK ® 307 | 0.3 |

TABLE II

Hydrophilic Overcoat Composition Coated as 6 weight % solution in water

| | Solids Content (%) |
|---|---|
| PVA 1 | 97.3 |
| Acticide ® LA 1206 | 0.2 |
| Phosphoric acid (85 weight %) | 0.3 |
| Surfynol ® 440 | 0.2 |
| Lutensol ® TO 109 | 2.0 |

Preparation of Lithographic Printing Plate Precursors P2 Sensitized for 405 nm Exposure:

An electrochemically roughened and anodized aluminum foil with an aluminum oxide weight of 2.75 g/m² was subjected to a post-treatment using an aqueous solution of poly(vinyl phosphoric acid). The average roughness of the resulting hydrophilic surface of this substrate was 0.55 µm.

An imageable layer coating composition having the components shown in TABLE III below was disposed onto the substrate after filtering using a wire bar coater. The coating was dried for 4 minutes at 90° C. to provide a dry imageable layer coating weight of 1.6 g/m².

A hydrophilic overcoat composition comprising the components shown in TABLE IV below was coated onto the imageable layer and dried for 4 minutes at 90° C. to provide a dry coating weight of 2 g/m².

TABLE III

Imageable Layer Composition Coated as 14 weight % solution in Dowanol ® PM/Acetone (9/1)

| | Solids Content (%) |
|---|---|
| Binder 2 | 30.7 |
| Kayamer PM-2 | 0.3 |
| PAM-100 | 3.0 |
| Monomer 1 | 38.0 |
| NK Ester PBE 500 | 8.4 |
| Sensitizer 1 | 5.4 |
| o-Cl-HABI | 8.4 |
| Mercaptobenzothiazole | 0.6 |
| BYK ® 307 | 0.2 |
| Pigment 2 | 5.0 |

TABLE IV

Hydrophilic Overcoat Composition Coated as 6 weight % solution in water

| | Solid Content (%) |
|---|---|
| PVA1 | 61.3 |
| PVA2 | 31.6 |
| Sokalan Luvitec VPC 55K 65W | 6.1 |
| Acticide ® LA 1206 | 0.02 |
| Surfynol ® 440 | 0.8 |
| Lutensol ® TO 109 | 0.2 |

Exposure and Processing of Lithographic Printing Plate Precursors P1:

The lithographic printing plate precursors P1 described above were imagewise exposed using a Kodak® Trendsetter 800 Quantum (exposure energy of 80 mJ/cm²) apparatus that was equipped with 830 nm laser sources. The imagewise exposed precursors were developed with using a processing solution having the components shown in TABLES V-A and V-B below and processing equipment arranged in different configurations. The photospeed of the exposed and processed precursors was assessed by measuring the sum of tonal values of 5%, 10%, 20%, 30%, 40%, 50%, 60%, 70%, 80%, 90%, and 95% nominal targets at 150 lpi.

A first processing configuration (identified herein as Comparative Process A1) used a conventional Kodak® SP500 developer (pH of 10) as the processing solution in a processing section (dip tank) containing two bristle brushes, a rinsing section for rinsing with water and including a bristle brush, a finishing section for application of a finishing solution, and a drying section. The processing solution (developer) was maintained at 23 C and the dip-to-nip dwell time was 20 seconds. In addition, the processing section was connected to a replenisher container that was filled with the same processing solution (developer) and to an overflow waste container. The finishing solution section was connected to a container filled with commercially available Kodak Plate Finisher 850S.

A second processing configuration (identified herein as Invention Process B1) included two successive processing sections in successive dip tanks, each dip tank containing two bristle brushes, and a drying section. The processing solution temperature in each dip tank was maintained at 23° C. and the dip-to-nip dwell time was 20 seconds for each dip tank. Each processing solution level was maintained by a connection to a replenisher container filled with the respective processing solution. The first application of processing solution to the exposed precursor was carried using a higher concentration of all of components (1) through (4) compared to the processing solution used in the second application to the exposed precursor. Thus, the processing solution used in the second application was diluted by 50% (1:2) compared to the processing solution used in the first application to the exposed precursor.

Exposure and Processing of Lithographic Plate Printing Precursors P2:

The lithographic printing plate precursors P2 were imagewise exposed using a Heidelberg Prosetter (exposure energy of 50 µJ/cm$^2$) apparatus that was equipped with a 405 nm laser diode. The imaged precursors were processed (developed) using a processing solution having the components shown below in TABLES V-A and V-B and processing equipment in the third and fourth processing configurations.

The third processing configuration (identified herein as Comparative Process A2) included a preheating section to preheat exposed precursor to 110° C., followed by a pre-rinsing section for rinsing the exposed and heated precursor with water with rubbing with a bristle brush. The treated precursor was then sent through a processing section having a dip tank filled with the conventional Kodak® SP500 developer as the processing solution and two bristle brushes, a rinsing section for rinsing the exposed and processed precursor with water while contacting with a bristle brush, a finishing section for application of a finishing solution, and a drying section. The processing solution was kept at 23° C. and the dip-to-nip dwell time was 20 seconds. The processing section was connected to a replenishing container filled with the same processing solution (developer) and to an overflow waste container. The finishing section was connected to a container filled with commercial Kodak Plate Finisher 850S. The photospeed of the exposed and processed precursors was assessed by measuring the sum of tonal values of 5%, 10%, 20%, 30%, 40%, 50%, 60%, 70%, 80%, and 90% nominal targets at 150 lpi.

A fourth processing configuration (identified herein as Invention Process B2) contained a preheating section for preheating the exposed precursor to 110° C.), two successive processing sections in successive dip tanks, each dip tank containing two bristle brushes, and a drying section. The processing solution temperature in each dip tank was maintained at 23° C. and the dip-to-nip dwell time was 20 seconds for each dip tank. Each processing solution level was maintained by a connection to a replenishes container filled with the respective processing solution. The first application of processing solution to the exposed precursor was carried using a higher concentration of all of components (1) through (4) compared to the processing solution used in the second application to the exposed precursor. Thus, the processing solution used in the second application was diluted by 50% (1:2) compared to the processing solution used in the first application to the exposed precursor.

Evaluation of Precursor Developability:

A sample of each lithographic printing plate precursor was cut into pieces of 300 mm×40 mm. A beaker was filled with 200 ml of the respective processing solution while the temperature was kept constant at 23° C. A piece of each precursor was dipped into the processing solution for a specific time period (for example, 5 seconds), followed by dipping the same piece to a subjacent level for some time (for example, 5 seconds). Gradually (for example, 5 second steps) each piece was dipped deeper into the processing solution and quickly pulled out after some time. Each piece was then rinsed with water and evaluated with respect to background cleanliness. To make sure the imageable layer coating had been removed completely, the piece was inked, and the time to have the imageable layer coating completely removed was taken as a measure of precursor developability. The following evaluations were used.

++ ≤5 seconds
+ >5 seconds, ≤10 seconds
0 >10 seconds, ≤20 seconds
− >20 seconds, ≤30 seconds
−− >30 seconds Evaluation of Lithographic Printing Plate Stickiness:

For an evaluation of the stickiness, each lithographic printing plate was evaluated at different stages of loading by comparison to a non-coated hydrophilic substrate. The following evaluations were made:

++ printing surface felt nearly like non-treated substrate even at high loadings;
+ printing surface felt slightly sticky only at high loadings;
0 printing surface felt slightly sticky from the beginning of loading cycle; and
− printing surface felt very sticky from the beginning of loading cycle.

Evaluation of Post-Processing Aging:

For an estimation of aging after processing with the processing solution, exposed and processed precursors that had been stored for 24 hours in the dark after processing and application of the finishing solution were compared with exposed and processed precursors evaluated immediately after processing with the processing solution. Each lithographic printing plate was then loaded into the same sheet-fed offset printing machine using abrasive ink (Offset S 7184 available from Sun Chemical that contains 10 weight % of calcium carbonate) and fountain solution (Boettcher Fount S-3021 available from Boettcher GmbH.). The non-imaged areas on each lithographic printing plate were checked for ink receptivity and the following assessments were made:

+ no background toning of lithographic printing plate directly after processing and also 24 hours after processing;
− no background toning for fresh lithographic printing plates but some toning as a lithographic printing plate 24 hours after processing; and
−− background toning for both fresh and aged lithographic printing plates.

Relative Run Length of Lithographic Printing Plates:

Each lithographic printing plate was loaded in a sheet-fed offset printing machine using abrasive ink (Offset S 7184 available from Sun Chemical that contains 10% of calcium carbonate, and a fountain solution was Böttcher Fount 5-3021 available from Böttcher GmbH). The run length was determined as the number of copies when the first sign of wear in the solid areas of the lithographic printing plate became visible. The effect of the processing solution used for processing on run length according to Invention Method B1 for Printing Plate Precursor P1 and Method B2 for Printing Plate Precursor P2 was accessed by comparing it with the run length after processing according to Comparative Method A1 for Printing Plate Precursor P1 and Comparative Method A2 for Printing Plate Precursor P2 and expressed in %, wherein run length of run after processing according to each of Comparative Methods A1 and A2 of P1 and P2 was defined as 100%.

Discussion of the Results:

From the results shown in TABLE VI below, it is clear that the method carried out according to the present invention resulted in exposed and processed precursors (lithographic printing plates) having low tackiness, low post development ageing, and high run length. Furthermore, the precursor photospeed was high and the processing speed was fast.

Very tacky plates (Comparative examples) were obtained when both the surfactant [component (2)] and the other necessary components (1) and (3) do not have the required melting point, glass transition temperature or pour point requirements as determined for this invention. Furthermore, those lithographic printing plates exhibited lower run length and higher post processing aging.

TABLE V-A (weight % based on total processing solution weight)

| Processing Solution | Physical Properties | D1 | D2 | D3 | D4 | D5 | D6 | D7 |
|---|---|---|---|---|---|---|---|---|
| Water | | 85.55 | 83.50 | 86.50 | 86.50 | 85.55 | 85.55 | 80 |
| Component (1) | | | | | | | | |
| | | | | | | | | |
| IRIS | $T_m$ of 175° C. | 4.90 | | | | 4.90 | 4.90 | 1 |
| Glycine | $T_m$ of 240° C. | | 4.00 | | 4.00 | | | |
| L4-Diazabicyclo[2.2.2] octane | $T_m$ of 159.8° C. | | | 5.00 | | | | |
| Triethanolamine | Liquid at 20° C. | | | | | | | |
| Component (2) | | | | | | | | |
| | | | | | | | | |
| Soprophorl ® TS54 | $T_m$ about 50° C. | 1.50 | 1.50 | 1.50 | | 1.50 | 1.50 | |
| Emuisogen ® TS160 | Liquid at 20° C. | | | | | | | |
| Emulsogen ® TS290 | Solid at room temperature | | | | 1.50 | | | |
| Genapol ® T 500 | Solid at room temperature | | | | | | | 2 |
| Lugalvae ® BNO 24 | Solid at room temperature | | | | | | | |
| Newcol B13 | Liquid at 20° C. | | | | | | | |
| Component (3) | | | | | | | | |
| | | | | | | | | |
| Ethylan HB4 | | 5.00 | 4.00 | 4.00 | | 5.00 | 4.00 | |
| Phenoxyethanol | | | | | 1.00 | | 1.00 | |
| Ethylene glycol-monobutylether | | | | | | | | 9 |
| Cyclohexanol | | | | | | | | |
| Component (4) | | | | | | | | |
| | | | | | | | | |
| Na-gluconate | | 3.00 | | | | 3.00 | | |
| Dextrin | | | 3.00 | 3.00 | 3.00 | | 3.00 | |
| Poly(vinyl pyrrolidone) | | | | | | | | 8 |
| Further Components | | | | | | | | |
| | | | | | | | | |
| Sodium hydroxide (33%) | | | 4.00 | | 4.00 | | | |
| Citric acid monohydrate | | 0.05 | | | | 0.05 | 0.05 | |
| pH | | 10.1 | 10.0 | 10.0 | 10.0 | 10.0 | 10.0 | 7.9 |

TABLE V-B (weight % based on total processing solution weight)

| Processing Solution | Physical Properties | D8 | D10 | D11 | D12 | D13 | D14 |
|---|---|---|---|---|---|---|---|
| Water | | 72 | 86.46 | 84.00 | 85.55 | 87.05 | 90.55 |
| Component (1) | | | | | | | |
| | | | | | | | |
| TRIS | $T_m$ of 175° C. | | | | 4.90 | 4.90 | 4.90 |
| Glycine | $T_m$ of 240° C. | | | | | | |
| 1,4-Diazabicyclo[2.2.2] octane | $T_m$ of 159.8° C. | 3 | | | | | |
| Triethanolamine | Liquid at 20° C. | | | 5.00 | 4.00 | | |
| Component (2) | | | | | | | |
| | | | | | | | |
| Soprophor ® TS54 | $T_m$ about 50° C. | | 1.50 | | | | 1.50 |
| Emulsogen ® TS160 | Liquid at 20° C. | | | 4.00 | | | |
| Emulsogen ® TS290 | Solid at room temperature | | | | | | |
| Genapol ® T 500 | Solid at room temperature | | | | | | |
| Lugalvan ® BNO 24 | Solid at room temperature | 10 | | | | | |
| Newcol B13 | Liquid at 20° C. | | | | | 1.50 | |

TABLE V-B-continued (weight % based on total processing solution weight)

| Processing Solution | Physical Properties | D8 | D10 | D11 | D12 | D13 | D14 |
|---|---|---|---|---|---|---|---|
| Component (3) | | | | | | | |
| Ethylan HB4 | | | 4.00 | 5.00 | 5.00 | 5.00 | |
| Phenoxyethanol | | | | | | | |
| Ethylene glycol-monobutylether | | | | | | | |
| Cyclohexanol | | 10 | | | | | |
| Component (4) | | | | | | | |
| Na-gluconate | | 5 | 3.00 | | 3.00 | 3.00 | 3.00 |
| Dextrin | | | | 3.00 | | | |
| Poly(vinyl pyrrolidone) | | | | | | | |
| Further Components | | | | | | | |
| Sodium hydroxide (33%) | | | | | | | |
| Citric acid monohydrate | | | 0.05 | | | 0.05 | 0.05 |
| PH | | 11.1 | 9.7 | 9.7 | 9.9 | 10.08 | 10.11 |

TABLE VI

| Example | Precursor | Processing Solution | Processing Method | Sum of Total Error | Developability | Plate Stickiness | Post-development Aging | Relative Run Length |
|---|---|---|---|---|---|---|---|---|
| Invention 1 | P1 | D1 | B1 | 566.6 | ++ | ++ | + | 100% |
| Invention 2 | P1 | D2 | B1 | 562.7 | ++ | ++ | + | 100% |
| Invention 3 | P1 | D3 | B1 | 563.7 | ++ | ++ | + | 100% |
| Invention 4 | P1 | D4 | B1 | 565.5 | ++ | ++ | + | 95% |
| Invention 5 | P1 | D5 | B1 | 567.6 | ++ | ++ | + | 100% |
| Invention 6 | P1 | D6 | B1 | 562.1 | ++ | ++ | + | 95% |
| Invention 7 | P1 | D7 | B1 | 566.2 | ++ | ++ | + | 90% |
| Invention 8 | P1 | D8 | B1 | 565.6 | ++ | ++ | + | 85% |
| Comparative 1 | P1 | D10 | B1 | 563.8 | 0 | 0 | − | 70% |
| Comparative 2 | P1 | D11 | B1 | 562.7 | ++ | − | − | 70% |
| Comparative 3 | P1 | D12 | B1 | 564.2 | + | 0 | + | 80% |
| Comparative 4 | P1 | D13 | B1 | 568.5 | − | + | + | 80% |
| Comparative 5 | P1 | D14 | B1 | 568.1 | −− | ++ | + | 100% |
| Invention 9 | P2 | D1 | B2 | 511 | ++ | ++ | + | 95% |
| Invention 10 | P2 | D2 | B2 | 521 | ++ | ++ | + | 100% |
| Invention 11 | P2 | D3 | B2 | 512 | ++ | ++ | + | 95% |
| Invention 12 | P2 | D4 | B2 | 522 | ++ | ++ | + | 100% |
| Invention 13 | P2 | D5 | B2 | 505 | ++ | ++ | + | 90% |
| Invention 14 | P2 | D6 | B2 | 518 | ++ | ++ | + | 100 |
| Invention 15 | P2 | D7 | B2 | 517 | ++ | ++ | + | 100% |
| Invention 16 | P2 | D8 | B2 | 503 | ++ | ++ | + | 95% |
| Comparative 6 | P2 | D10 | B2 | 531 | 0 | + | − | 85 |
| Comparative 7 | P2 | D11 | B2 | 516 | ++ | − | − | 90 |
| Comparative 8 | P2 | D12 | B2 | 521 | ++ | − | − | 90 |
| Comparative 9 | P2 | D13 | B2 | 528 | − | 0 | + | 80 |
| Comparative 10 | P2 | D14 | B2 | 525 | − | ++ | + | 90 |

The invention has been described in detail with particular reference to certain preferred embodiments thereof, but it will be understood that variations and modifications can be effected within the spirit and scope of the invention.

The invention claimed is:

1. A method for preparing a lithographic printing plate, the method comprising:
   (a) imagewise exposing a negative-working lithographic printing plate precursor comprising a substrate having disposed thereon a negative-working radiation-sensitive imageable layer, and optionally, a hydrophilic overcoat disposed on the negative-working radiation-sensitive imageable layer, to provide an exposed precursor comprising exposed regions and non-exposed regions in the negative-working radiation-sensitive imageable layer;
   (b) optionally heating the exposed precursor to a temperature of at least 60° C. and up to and including 180° C.;
   (c) optionally washing the exposed precursor to remove the hydrophilic overcoat;
   (d) treating the exposed precursor with one or more successive applications of a processing solution to provide an exposed and processed precursor, the processing solution having a pH of at least 7 and up to and including 11 and comprising:
      component (1) that is a nitrogen-containing base having an atmospheric pressure melting point of at least 40° C., and is present in an amount of at least 1 weight % based on the total processing solution weight;
      component (2) that is a non-ionic surfactant that independently has an atmospheric pressure melting point, glass transition temperature, or pour point of at least 40° C., and is present in an amount of at least 1 weight % based on the total processing solution weight;

component (3) that is a hydroxy-containing solution promoter that is present in an amount of at least 0.5 weight % based on the total processing solution weight; and component (4) that is a hydrophilic surface protective compound that can be present in an amount of at least 1 weight % based on the total processing solution weight;

(e) optionally, drying the exposed and processed precursor; and (f) mounting the exposed and processed precursor on a printing press, with the proviso that the exposed precursor is not further treated with any liquid between (d) and (f), and component (2) is represented by the formula:

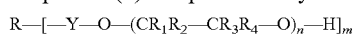

wherein:
R is a substituted or unsubstituted aryl group, provided R contains no ionic group;
$R_1$, $R_2$, $R_3$, and $R_4$ are independently hydrogen, methyl, or ethyl;
Y is a single bond or a divalent linking group;
n is an integer of at least 20 and up to and including 100; and
m is an integer of 1 and up to and including 3, and
component (2) comprises at least 20 ethylene oxide or propylene oxide units.

2. The method of claim 1, wherein component (1) contains no ionic group.

3. The method of claim 1, wherein component (1) contains no carboxylic acid group.

4. The method of claim 1, wherein component (1) is present in the processing solution in an amount of at least 1 weight % and up to and including 10 weight %, based on total processing solution weight, and component (1) is selected from the group consisting of:
2-amino-2-hydroxymethyl-propane-1,3-diol, 1,3-bis(tris(hydroxymethyl)methylamino)propane, bis(2-hydroxyethyl)-amino-tris(hydroxymethyl)-methane, triethylene diamine, melamine, piperazine, urotropine, poly(ethylene imine), glycine, alanine, 2-aminoethane sulfonic acid, 3-[[1,3-dihydroxy-2-(hydroxymethyl)propan-2-yl]amino]propane-1-sulfonic acid, 3-[[1,3-dihydroxy-2-(hydroxymethyl)propan-2-yl]amino]-2-hydroxypropane-1-sulfonic acid, N-[tris(hydroxymethyl)methyl] glycine, N,N-bis(2-hydroxyethyl)glycine, 2-(N-morpholino)ethanesulfonic acid, 4-(2-hydroxyethyl)-1-piperazineethanesulfonic acid, 4-morpholinepropanesulfonic acid, and pyrrolidone-2-carboxylic acid.

5. The method of claim 1, wherein component (2) is present in the processing solution in an amount of at least 1 weight % and up to and including 10 weight %, based on total processing solution weight.

6. The method of claim 1, wherein component (3) is present in the processing solution in an amount of at least 0.5 weight % and up to and including 5 weight %, based on the total processing solution weight, and component (3) is selected from the group consisting of (i) an ethoxylated phenol or ethoxylated naphthol comprising at least 1 and up to and including 7 ethyleneoxy units, (ii) an alkoxylated phenol or alkoxylated naphthol comprising at least 1 and up to and including 7 alkoxyoxy units wherein the alkoxy has 2 to 4 carbon atoms, (iii) an ethyloxylated aliphatic alcohol comprising at least 1 and up to and including 7 ethyleneoxy units and an aliphatic moiety having 1 to 8 carbon atoms, and (iv) and alkoxylate aliphatic alcohol comprising at least 1 and up to and including 7 alkoxylated units wherein the alkoxy has 1 to 2 to 4 carbon atoms and aliphatic moiety having 1 to 8 carbon atoms.

7. The method of claim 1, wherein, one or more of the following conditions are met in the processing solution:
component (1) is present in an amount of at least 1 weight % and up to and including 10 weight %,
component (2) is present in an amount of at least 1 weight % and up to and including 10 weight %,
component (3) is present in an amount of at least 0.5 weight % and up to and including 5 weight %, or
component (4) is present in an amount of at least 1 and up to and including 10 weight %,
all based on the total processing solution weight.

8. The method of claim 1, wherein component (4) is present in the processing solution in an amount of at least 1 weight % and up to and including 10 weight %, based on the total processing solution weight, and component (4) is selected from soy polysaccharides, modified starches, gum arabic, dextrin, cellulose derivatives, pullulan, a poly(vinyl alcohol), a poly(vinyl pyrrolidone), a poly(meth)acrylamide, a vinyl methyl ether/maleic anhydride copolymer, a vinyl acetate/maleic anhydride copolymer, a styrene/maleic anhydride copolymer, and a hydroxycarboxylate salt.

9. The method of claim 1, wherein component (4) has an acid value of 0 and up to and including 3 meq KOH/gram of component (4).

10. The method of claim 1, comprising treating the exposed precursor with two successive applications of the processing solution.

11. The method of claim 1, comprising treating the exposed precursor with two successive applications of the processing solution, wherein in the first of the two successive applications of processing solution, the processing solution comprises components (1) to (4), but at least one of the components (1) to (4) is present at a concentration that is greater than the corresponding component (1) to (4) in the processing solution used in the second of the two successive applications of processing solutions.

12. The method of claim 1, wherein each of the one or more successive applications of the processing solutions is carried out in a dip tank or spray bar processor at a temperature of at least 20° C. and up to and including 40° C., and optionally while using at least one rotating brush.

13. The method of claim 1, wherein after treating the exposed precursor with the one or more successive applications of the processing solution, (e) drying the exposed precursor with hot air at a temperature of at least 40° C. and up to and including 150° C.

14. The method of claim 1, wherein the negative-working radiation-sensitive imageable layer is sensitized to near-infrared or infrared radiation having a wavelength of at least 750 nm.

15. The method of claim 1, wherein the negative-working radiation-sensitive imageable layer is sensitized to violet or visible radiation having a wavelength of at least 250 nm and up to and including 550 nm.

16. The method of claim 1, consisting essentially of (a) through (f), wherein (f) is carried out using hot air.

17. The method of claim 16, consisting essentially of (a) through (f), wherein (d) treating is carried out with two successive applications of the same processing solution.

* * * * *